United States Patent
Patwardhan et al.

(10) Patent No.: US 7,407,716 B2
(45) Date of Patent: *Aug. 5, 2008

(54) LIGHT EMITTING DEVICES WITH MULTIPLE LIGHT EMITTING LAYERS TO ACHIEVE BROAD SPECTRUM

(75) Inventors: Aditee Patwardhan, Sunnyvale, CA (US); Vi En Choong, San Jose, CA (US)

(73) Assignee: Osram Opto Semiconductors GmbH (DE)

( * ) Notice: Subject to any disclaimer, the term of this patent is extended or adjusted under 35 U.S.C. 154(b) by 218 days.

This patent is subject to a terminal disclaimer.

(21) Appl. No.: 11/159,893

(22) Filed: Jun. 22, 2005

(65) Prior Publication Data

US 2006/0043887 A1 Mar. 2, 2006

Related U.S. Application Data

(63) Continuation-in-part of application No. 10/932,830, filed on Sep. 1, 2004.

(51) Int. Cl.
*H01L 51/50* (2006.01)
*B05D 5/06* (2006.01)

(52) U.S. Cl. .............. 428/690; 428/917; 313/504; 313/506; 427/66

(58) Field of Classification Search ........... 428/690, 428/917, 212; 313/504, 506; 427/66
See application file for complete search history.

(56) References Cited

U.S. PATENT DOCUMENTS

| | | | |
|---|---|---|---|
| 5,807,627 A | 9/1998 | Friend et al. | |
| 6,559,256 B2 | 5/2003 | Holmes et al. | |
| 6,982,179 B2 | 1/2006 | Kwong et al. | |
| 2004/0046495 A1 | 3/2004 | Peng | |
| 2004/0069995 A1 | 4/2004 | Magno et al. | |
| 2004/0124766 A1 | 7/2004 | Nakagawa et al. | |
| 2005/0100658 A1* | 5/2005 | MacPherson et al. | 427/58 |
| 2005/0156176 A1* | 7/2005 | Gupta et al. | 257/79 |
| 2005/0158523 A1 | 7/2005 | Gupta et al. | |

OTHER PUBLICATIONS

Muller et al., "Multi-colour organic light emitting displays by solution processing", Nature, vol. 421, pp. 829-833 (2003).
Clearfield, H.M., Progress in the Commercialization of Lumation* Light-Emitting Polymers (LEPs), Dow Chemical Company, OLEDs Asia, 2004, pp. 1-23.
Kawamura, Yuichiro et al., "Energy transfer in polymer electrophosphorescent light emitting devices with single and multiple doped luminscent layers", Journal of Applied Physics, vol. 92, No. 1, Jul. 1, 2002, pp. 87-93.
Meulenkamp, Eric A. et al., "High efficiency polymer LEDs: triplets and novel devices", no date provided.
Lee, Jeong-II et al., "White light emitting diodes using polymer blends", Optical Materials 21 (2002) 205-210.
Kido, Junji et al., "Multilayer White Light-Emitting Organic Electroluminescent Device", Science, vol. 267, Mar. 3, 1995, 1332-1334.

* cited by examiner

*Primary Examiner*—Dawn Garrett
(74) *Attorney, Agent, or Firm*—Dickstein, Shapiro, LLP.

(57) ABSTRACT

What is disclosed is an organic electroluminescent device which produces a white output spectrum. A plurality of emissive layers, each emitting in a particular spectrum, are fabricated together in one device by choosing materials with solubility properties that do not affect adjacent layers.

33 Claims, 2 Drawing Sheets

LIGHT EMITTING DEVICES WITH MULTIPLE LIGHT EMITTING LAYERS TO ACHIEVE BROAD SPECTRUM

RELATED APPLICATIONS

This application is a continuation-in-part of a pending U.S. patent application Ser. No. 10/932,830 entitled "White Organic Electroluminescent Device" filed on Sep. 1, 2004.

BACKGROUND

1. Field of the Invention

This invention relates generally to the art of organic electronic devices. More specifically, the invention relates to Organic Light Emitting Diode devices.

2. Related Art

Display and lighting systems based on LEDs (Light Emitting Diodes) have a variety of applications. Such display and lighting systems are designed by arranging a plurality of photo-electronic devices such as arrays of individual LEDs. LEDs that are based upon semiconductor technology have traditionally used inorganic materials, but recently, the organic LED ("OLED") device and displays based thereon has come into vogue for certain applications.

An OLED is typically comprised of two or more thin at least partially conducting organic layers (e.g., an electrically conducting hole transporting polymer layer (HTLs) and a light emissive polymer (LEP) layer) which are sandwiched between an anode and a cathode. Under an applied forward potential, the anode injects holes into the conducting polymer layer, while the cathode injects electrons into the emissive polymer layer. The injected holes and electrons each migrate toward the oppositely charged electrode and form an exciton in the emissive polymer layer. The exciton relaxes to a lower energy state by emitting a photon.

The color of light emission from such a device structure is controlled by emission properties of the LEP layer. For example, white emission can be achieved by blending a blue-emitting LEP with polymers (or small molecules) that emit in green and red regions of spectrum (see e.g. J.-I. Lee et al, *Optical Materials* 21, 205-210 (2002) and Y. Kawamura et al, *Journal of Applied Physics* 92, 87-93 (2002)). In this case direct carrier trapping and/or energy transfer from the blue host to the red and green dopants will redistribute emission between blue, green and red chromophores thus resulting in white emission. A similar approach is to synthesize a copolymer incorporating all three types of chromophores in one polymer chain thus preventing possible phase separation that may occur in a blend.

However the above approaches have several drawbacks. Doping with emitting chromophores not only changes the emission spectrum but can also result in undesirable changes in charge transport (e.g. due to trapping of charges) properties of the host LEP. In addition to that, as only very small concentrations of emitting dopants are required to change the color of emission, it could be difficult to precisely control relative concentrations of the dopants in order to achieve desirable and reproducible emission color.

Organic LEDs based on small molecule materials (SMOLEDs) offer several advantages over the PLEDs as far as the fabrication of white emitting OLEDs is concerned. Apart from doping one emitting layer with different chromophores, as in the PLED approaches above, white light emission can be achieved by fabricating multilayer structures, the approach that can be easily implemented by sequential vacuum deposition of required organic layers (J. Kido et al, *Science* 267, 1332 (1995)), emitting in different regions of the visible spectrum.

It would be advantageous to design and fabricate a device structure that can utilize a wide variety of polymers to produce a broad spectrum emitting OLED device or display.

DETAILED DESCRIPTION OF THE INVENTION

Figure 1:
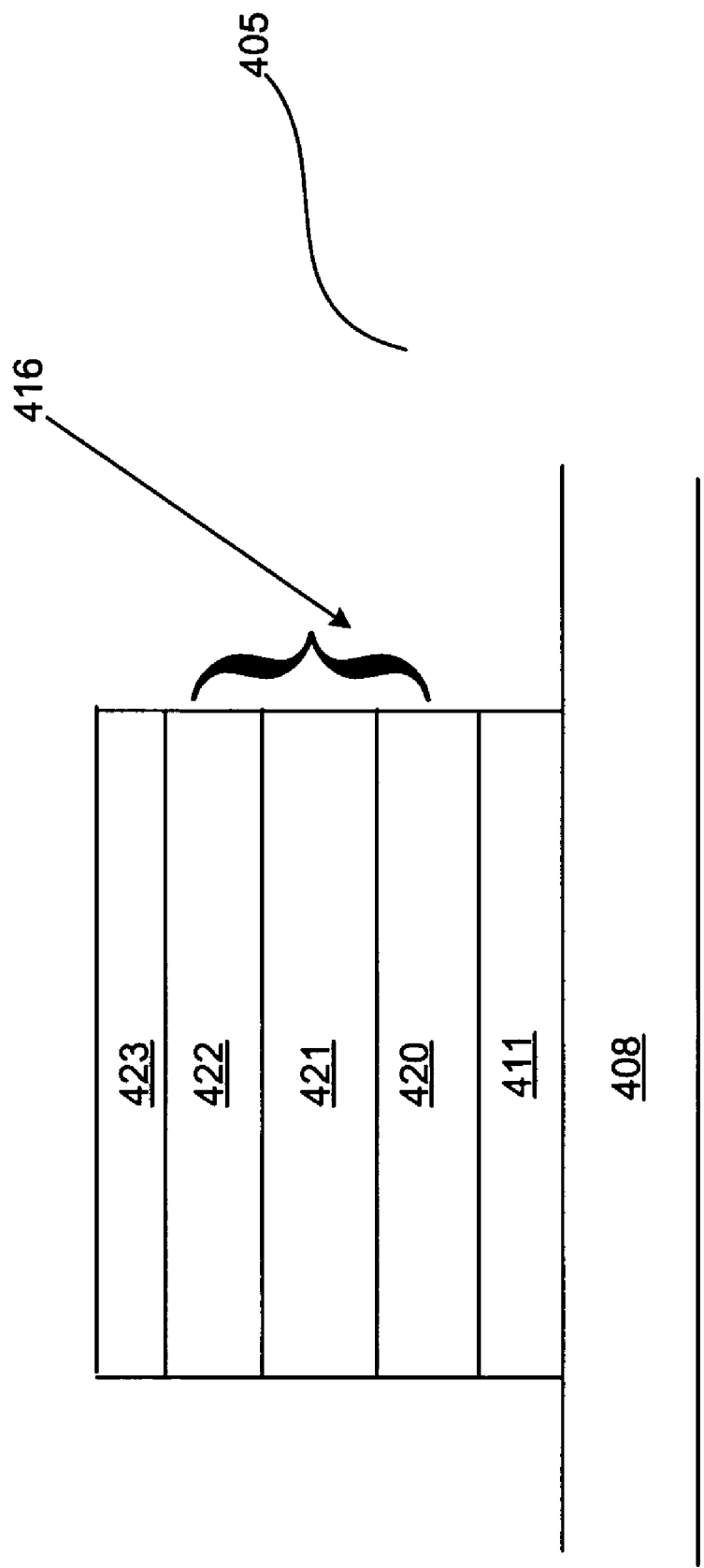
FIG. 1 shows a cross-sectional view of an organic electroluminescent device with three emissive layers according to at least one embodiment of the invention.

In accordance with the invention, a multiple emissive layer organic electroluminescent device is disclosed. The device contains a plurality of emissive layers, each emissive layer emitting light in a particular spectrum. The device is created by fabricating a first emissive layer capable of emitting in a first spectrum with a first solubility characteristic. Afterwards, over the first emissive layer, a second emissive layer is fabricated which is capable of emitting in a second spectrum with a second solubility characteristic. Likewise, over the second emissive layer, a third emissive layer is fabricated which is capable of emitting in a third spectrum with a third solubility characteristic. The first solubility characteristic and second solubility characteristic is such that the second emissive layer will not degrade in the solvent used in fabricating the first emissive layer. Likewise, the second solubility characteristic and third solubility characteristic is such that the third emissive layer will not degrade in the solvent used in fabricating the second emissive layer. This will prevent previously fabricated emissive layer from being degraded by other solvents that are deposited over it during the fabrication of the subsequent emissive layer.

In at least one embodiment of the invention, a white-emitting OLED device/display is created by the use of three organic emissive layers. The first organic emissive layer is a luminescent polymer emitting in a red spectrum. The second emissive layer is capable of emitting light in a blue spectrum, and the third emissive layer in a green spectrum. When light emitted from the first emissive layer combines with light emitted from the second and third emissive layers, the total output spectrum of the device would be white. In alternate embodiments of the invention, the spectra of each emissive layer can be switched as desired so that the first emissive layer emits in blue, the second in red, and the third in green, for example. In some embodiments of the invention, a device with three emissive layers along with a hole transport layer and an electron transport layer are disclosed.

Each emissive layer described above may include individual emissive and non-emissive "components" including one or more of a polymer, monomer, oligomer, co-polymer, an organic side-group, and small molecule. In describing the invention, the terms "solution," "layer" and "film" refer to the same material which may be in different physical states before, during and after fabrication. When an organic "solution" is deposited on a surface, it often dries over time into a "film" often aided by heat or other factors. The film then becomes a layer in a device capable of carrying out specific functions. Also, the words "polymer solution" and "organic solution" are used interchangeably to refer to any organic compound, monomer, oligomer, polymer, polymer blend, and the like and is not intended to be restrictive to any one organic compound or class of compounds.

FIG. 1 shows a cross-sectional view of an organic electroluminescent device with three emissive layers according to at least one embodiment of the invention. As shown in FIG. 1, the organic electroluminescent device includes a first electrode 411 on a substrate 408. As used within the specification and the claims, the term "on", "over", "above" includes layers that are in physical contact (adjacent) and layers that are separated by one or more intervening layers, or air or other substances. The first electrode 411 may be patterned for pixilated applications or unpatterned for backlight applications. A photo-resist material may be deposited on the first electrode 411 and patterned to form a bank structure (not pictured) having an aperture that exposes the first electrode 411. The aperture may be a pocket (e.g., a pixel of an OLED display) or a line.

One or more organic materials is deposited onto the first electrode 411 (and into the aperture, if available) to form one or more organic layers of an organic stack 416. One or more of the layers (films) comprising organic stack 416 are, in accordance with the invention, cross-linked to become insoluble. The organic stack 416 is disposed above the first electrode 411. The organic stack 416 includes three emissive layers 420, 421 and 422. If the first electrode 411 is an anode, then the first emissive layer 420 is on the first electrode 411. Alternatively, if the first electrode 411 is a cathode, then the third emissive layer 422 is on the first electrode 411. The electroluminescent device also includes a second electrode 423 (which is either a cathode or anode depending upon the first electrode 411) on the organic stack 416.

As shown in various other embodiments, adding additional layers may be desirable in order to improve performance of devices and may include functionalities such as hole transport, electron transport, hole blocking, optical confinement etc. In accordance with some embodiments of the invention, both a hole blocking and electron blocking layers accompany three emissive layers.

In addition a layer made of a single material may be able to provide more than one functionality, for example the same layer may provide hole transport, electron blocking and optical waveguiding. The layers shown in FIG. 1 and FIG. 2, in accordance with the invention, are described in greater detail below.

Substrate 408:

The substrate 408 can be any material that can support the organic and metallic layers on it. The substrate 408 can be transparent or opaque (e.g., the opaque substrate is used in top-emitting devices). By modifying or filtering the wavelength of light which can pass through the substrate 408, the color of light emitted by the device can be changed. The substrate 408 can be comprised of glass, quartz, silicon, plastic, or stainless steel; preferably, the substrate 408 is comprised of thin, flexible glass. The preferred thickness of the substrate 408 depends on the material used and on the application of the device. The substrate 408 can be in the form of a sheet or continuous film. The continuous film can be used, for example, for roll-to-roll manufacturing processes which are particularly suited for plastic, metal, and metallized plastic foils. The substrate can also have transistors or other switching components built in to control the operation of the device.

First Electrode 411:

In one configuration, the first electrode 411 functions as an anode. The anode is a conductive layer which serves as a hole-injecting layer and which typically comprises a material with work function greater than about 4.5 eV. Typical anode materials include metals (such as platinum, gold, palladium, and the likes); metal oxides (such as lead oxide, tin oxide, ITO (indium tin-oxide), and the likes); graphite; doped inorganic semiconductors (such as silicon, germanium, gallium arsenide, and the likes); and doped conducting polymers (such as polyaniline, polypyrrole, polythiophene, and the likes).

For OLEDs, the first electrode layer 411 is usually thin enough so as to be semi-transparent and allow at least a fraction of light to transmit through (in bottom emitting OLEDs). The thickness of the first electrode 411 is from about 10 nm to about 1000 nm, preferably, from about 50 nm to about 200 nm, and more preferably, is about 100 nm. As such, any thin-film deposition method may be used in the first electrode fabrication step. These include, but are not limited to, vacuum evaporation, sputtering, electron beam deposition, chemical vapor deposition, etching and other techniques known in the art and combinations thereof. The process also usually involves a baking or annealing step in a controlled atmosphere to optimize the conductivity and optical transmission of anode layer. Photolithography can then be used to define any pattern upon the first electrode 411.

In accordance with the invention, the top exposed surface of first electrode 411 might become the deposition surface upon which the organic solution for the first emissive layer 420. In an alternative configuration, the first electrode layer 411 functions as a cathode (the cathode is a conductive layer which serves as an electron-injecting layer and which comprises a material with a low work function). The cathode, rather than the anode, is deposited on the substrate 408 in the case of, for example, a top-emitting OLED. Typical cathode materials are listed below in the section for the "second electrode 423". In cases where the first electrode is a cathode, the second emissive layer 421 would be deposited/fabricated thereon.

First Emissive Layer 420:

First emissive layer 420 can include one or more components processed into film. Preferably, at least some part of the first emissive layer 420 is a polymer or similar organic-based film, thought the layer 420 may also have inorganic components.

The first emissive layer 420 contains at least one organic component ("first emissive component") that is capable of emitting light when activated. Such components generally fall into two categories. The first category of OLEDs, referred to as polymeric light emitting diodes, or PLEDs, utilize components such as polymers in the first emissive layer 420. The polymers may be organic or organometallic in nature. As used herein, the term organic also includes organometallic materials. Devices utilizing polymeric components in first emissive layer 420 are especially preferred.

The first emissive component is one or more electroluminescent ("EL") polymers that emit light. The first emissive component can consist of, for example, conjugated EL polymers, such as polyfluorenes, polythiophenes, polyphenylenes, polythiophenevinylenes, or poly-p-phenylenevinylenes or their families, copolymers, derivatives, or mixtures thereof.

In accordance with the invention, the first emissive layer may also contain at least one non-emissive component. Non-emissive components may include, for instance, interlayer functionality such as hole transport. The first emissive component and non-emissive component can be blended physically, chemically reacted, cross-linked or otherwise bonded or doped with one another. The first emissive layer can be deposited via spin coating, inkjet printing or other deposition techniques. The first emissive component can be, for example, any class or type of EL conjugated polymers, such as polyfluorenes; poly-p-phenylenevinylenes (PPV) that emit any spectrum of light and are 2-, or 2,5-substituted poly-p-pheneylenevinylenes; polyspiro polymers; or their families, copolymers, derivatives, or mixtures thereof.

In addition to polymers, organic monomers or oligomers that emit by fluorescence or by phosphorescence can serve as first emissive component residing in first emissive layer 420, if blended with a polymer containing cross-linkable groups. Combinations of polymeric and smaller organic molecules can also serve as the first emissive component in first emissive layer 420. For example, a first emissive component may be chemically derivatized with a small organic molecule or simply mixed with a small organic molecule in forming first emissive layer 420.

In addition to active electronic materials that emit light, first emissive layer 420 can include a material capable of charge transport. Charge transport materials include polymers or small molecules that can transport charge carriers. For example, organic materials such as polythiophene, derivatized polythiophene, oligomeric polythiophene, derivatized oligomeric polythiophene, pentacene, compositions including C60, and compositions including derivatized C60 may be used.

In some embodiments of the invention, the first emissive layer 420 has only one emissive component. Likewise, in some embodiments of the invention, the first emissive layer 420 may have only one non-emissive component, however, in alternate embodiments it may have several non-emissive components. In yet other embodiments, the first emissive layer 420 can be composed of a non-emissive conjugated polymer doped with an emissive monomer or an oligomer.

In accordance with the invention, the device 405 is capable of producing an output spectrum that is white or nearly white. In this regard, in some embodiments, first emissive layer 420 can emit light in a particular spectrum ("first spectrum"), preferably one distinct particular color such as red, green, blue, yellow, orange, or cyan, or any other color. In other embodiments, the first spectrum may include a combination of colors such as red and green, or red and blue, or blue and green, and so on. The first emissive component is chosen such that when activated it is capable of emitting light in the first spectrum. The particular color or colors of the first spectrum are not limited in any sense.

Second Emissive Layer 421

In accordance with the invention, a second emissive layer 421 is fabricated over the first emissive layer 420 to provide a broader output spectrum such as that needed for white light. The second emissive layer 421 may be composed of components similar in structure and composition to that described above for first emissive layer 420. Thus, each of the components comprising second emissive layer 421 may be at least one or more of a polymer, polymer blend, monomer, oligomer, co-polymer, and an organic side-group. So, for instance, the second emissive layer may consist of a blend of two emissive polymers, an emissive polymer doped with an emissive small molecule or a co-polymer with a plurality of emissive chromophores incorporated on the polymer chain or as pendant groups.

The second emissive layer 421 is capable of emitting light of a different distinct color to that of the first emissive layer 420. The light emission from the second emissive layer is a "second spectrum" (which may consist of more than one different color spectra combined). The second emissive layer 421 is fabricated using a solvent such that the second emissive layer 421 does not degrade or dissolve in the solvent used in fabricating the first emissive layer 420 and vice-versa. For example, PPV type polymers dissolve well in Toluene, however the solubility in Xylene: Melistylene is low. Thus, first emissive layer 420 can be a PPV type polymer while second emissive layer 421 can be a polyfluorene.

Third Emissive Layer 422

In accordance with the invention, a third emissive layer 422 is fabricated over the second emissive layer 421 to provide a broader output spectrum such as that needed for white light. The third emissive layer 422 may be composed of a component or components similar in structure and composition to that described above for first emissive layer 420. Thus, each of the components comprising third emissive layer 422 may be at least one or more of a polymer, polymer blend, monomer, oligomer, co-polymer, and an organic side-group.

The third emissive layer 422 is capable of emitting light of a different distinct color to that of the first emissive layer 420 and the second emissive layer 421. The light emission from the third emissive layer is a "third spectrum" (which may consist of more than one different color spectra combined). The third emissive layer 422 is fabricated using a solvent such that the third emissive layer 422 does not degrade or dissolve in the solvent used in fabricating the first emissive layer 421 and vice-versa.

In one embodiment of the invention, the first spectrum (emitted by first emissive layer 420), the second spectrum (emitted by second emissive layer 421) and the third spectrum (emitted by third emissive layer 422) combine to give a white output spectrum from device 405. Thus, if the first emissive layer emits a first spectrum of blue, the second emissive layer could emit in the second spectrum of red and the third emissive layer in the third spectrum of green. The spectral character and concentrations of the emissive components in each layer can be modified based upon the exact output color desired. For instance, a white output spectrum from device 405 can be given a more pinkish hue by adjusting the concentration of the red emissive components or by selecting a red emissive component that provides a deeper red color.

To enable multiple layer structure first emissive layer 420, the second emissive layer 421 and the third emissive layer 422 have to be polymers with different solubility properties. However, alternating polymers (such as the first emissive layer 420 and the third emissive layer 422) can have similar solubility properties. The emissive layers 420, 421, and 422 can have similar moieties for charge transport, with different fluorescent dopants as carrier traps.

The mobilities of emissive layers 420, 421 and 422 will control the recombination zone in the device structure. A large recombination zone is necessary to get emission from all three polymers. For instance, the hole mobility of first emissive layer 420 is greater than the hole mobility of second emissive layer 421 and the hole mobility of second emissive layer 421 is greater than the hole mobility of third emissive layer 422. Likewise, the electron mobility of first emissive layer 420 is less than the electron mobility of second emissive layer 421 and the electron mobility of second emissive layer 421 is less than the electron mobility of third emissive layer 422. A large emission zone will ensure that during aging of the device, the possible movement of the recombination zone will not result in spectrum changes.

Second Electrode (423)

In one embodiment, second electrode 423 functions as a cathode when an electric potential is applied across the first electrode 411 and second electrode 423. In this embodiment, when an electric potential is applied across the first electrode 411, which serves as the anode, and second electrode 423, which serves as the cathode, photons are emitted from the first emissive layer 420 and the second emissive layer 421.

While many materials, which can function as a cathode, are known to those of skill in the art, most preferably a composition that includes aluminum, indium, silver, gold, magnesium, calcium, lithium, lithium fluoride, cesium fluoride, sodium fluoride, and barium, or combinations thereof, or alloys thereof, is utilized. Aluminum, and combinations of calcium and aluminum, barium and aluminum, lithium fluoride and aluminum, lithium fluoride with calcium and aluminum, magnesium and silver or their alloys are especially preferred.

Preferably, the thickness of second electrode 423 is from about 10 to about 1000 nanometers (nm), more preferably from about 50 to about 500 nm, and most preferably from about 100 to about 300 nm. While many methods are known to those of ordinary skill in the art by which the first electrode material may be deposited, vacuum deposition methods, such as thermal vacuum evaporation, sputtering or electron-beam deposition are preferred. Other layers (not shown) such as a barrier layer and getter layer may also be used to protect the electronic device. Such layers are well-known in the art and are not specifically discussed herein.

Often processing steps such as washing and neutralization of films, the addition of masks and photo-resists may precede the cathode deposition. However, these are not specifically enumerated as they do not relate specifically to the novel aspects of the invention. Other steps like adding metal lines to connect the anode lines to power sources may also be utilized in the various embodiments of the invention. For instance, after the OLED is fabricated it is often encapsulated to protect the layers from environmental damage or exposure. Such other processing steps are well-known in the art and are not a subject of the invention.

Figure 2:
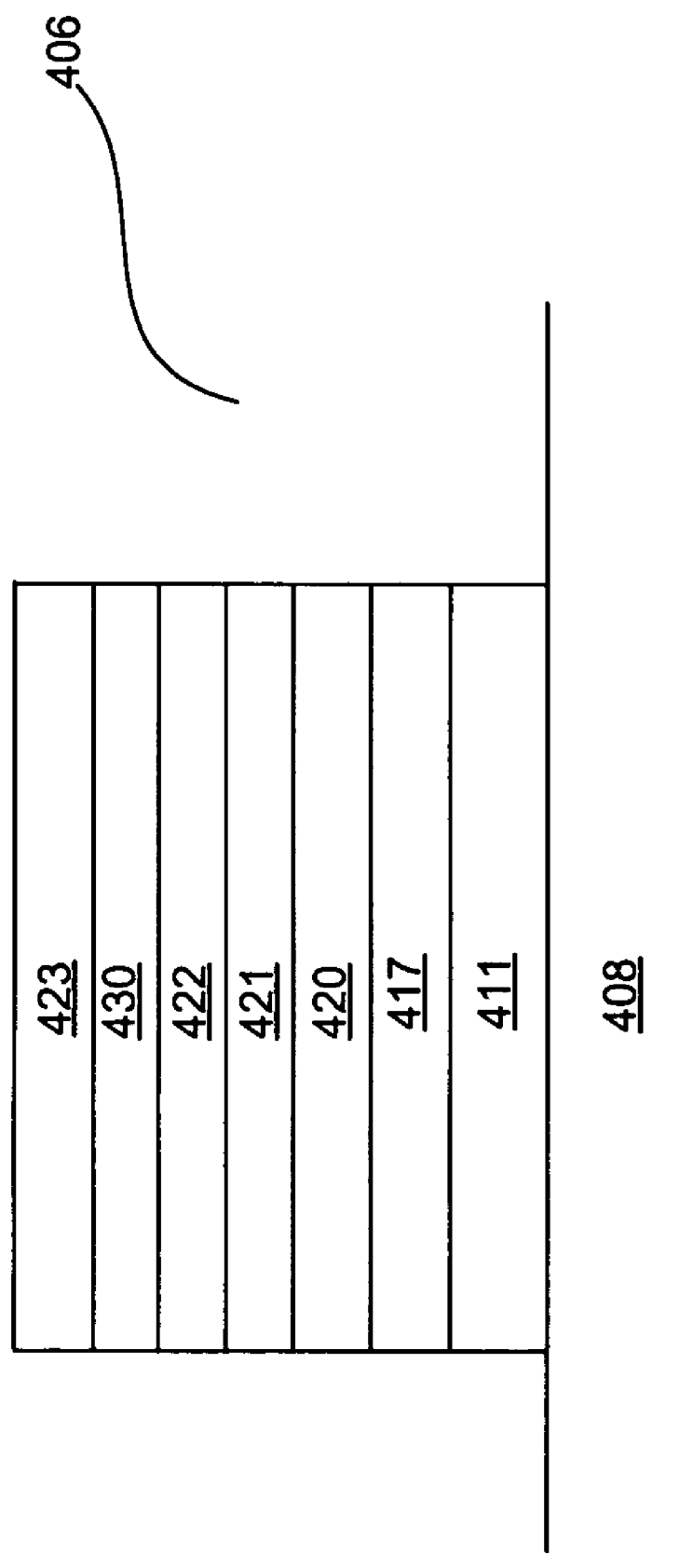
FIG. 2 shows a cross-sectional view of an organic electroluminescent device with three emissive layers and charge transport layers according to at least one embodiment of the invention.

FIG. 2 shows a cross-sectional view of an organic electroluminescent device with three emissive layers and charge transport layers according to at least one embodiment of the invention. The device 406 is identical in all or most aspects to device 405 of FIG. 2 except for the following.

HTL 417:

The HTL (Hole Transporting Layer) 417 typically has a much higher conductivity than the subsequent organic layers and serves several purposes as outlined below: (1) a buffer to provide a good bond to the substrate; and/or (2) a hole injection layer to promote hole injection; and/or (3) a hole transport layer to promote hole transport. In accordance with the invention, HTL 417 may also act as an electron blocking layer.

The HTL 417 can be formed by deposition of an organic solution, polymers, monomers, side-groups, inorganic materials, dopants and/or small molecule materials. For example, the HTL 417 can be made of tertiary amine or carbazole derivatives both in their small molecule or their polymer form, or organic solutions such as conducting polyaniline ("PANI"), or preferably, solutions of "PEDOT:PSS." A PEDOT:PSS solution is comprised of water, polyethylenedioxythiophene ("PEDOT"), and polystyrenesulfonic acid ("PSS") (this solution is referred to, herein, as a PEDOT:PSS solution and may be combined with or contain other components as well. The HTL 417 has a thickness from about 5 nm to about 1000 nm, preferably from about 20 nm to about 500 nm, and more preferably from about 50 to about 250 nm.

The HTL 417 can be deposited using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating. The hole transporting material is deposited on the first electrode 411 and then dried into a film. The dried material represents the HTL 417.

ETL 430

The ETL (Hole Transporting Layer) 430 typically is used to promote electron transport and can additionally serve as a hole blocking layer. ETL 430 can be formed by deposition of an organic solution, polymers, monomers, side-groups, inorganic materials, dopants and/or small molecule materials.

Some exemplary materials that can be used to fabricate ETL 430 include, but are not limited to 2-(4-tert-Butylphenyl)-5-(4-biphenylyl)-1,3,4-oxadiazole (PBD), spiro-2-(biphenyl-4-yl)-5-(tert-butylphenyl)-1,3,4-oxadiazole or other oxadiazoles, Polyquinoline and its derivatives, N,N'-Bis(4-(2,2-diphenylethen-1-yl)phenyl)-N, and N'-bis(4-methylphenyl)benzidine. ETL 430 can be deposited using selective deposition techniques or nonselective deposition techniques. Examples of selective deposition techniques include, for example, ink jet printing, flex printing, and screen printing. Examples of nonselective deposition techniques include, for example, spin coating, dip coating, web coating, and spray coating.

All of the organic or polymer layers and emissive layers mentioned herein can be fabricated from a solution by ink-jet printing or spun coating or otherwise deposited. The solution used may be any "fluid" or deformable mass capable of flowing under pressure and may include solutions, inks, pastes, emulsions, dispersions and so on. The solution may also contain or be supplemented by further substances or solvents and the like which affect viscosity, contact angle, thickening, affinity, drying, dilution and so on of the deposited solution.

The OLED devices described above can be used within displays in applications such as, for example, computer displays, information displays in vehicles, television monitors, telephones, printers, and illuminated signs. The OLED devices discussed can also be used in general area lighting, industrial lighting and any variety of lighting applications.

What is claimed is:

1. An organic electroluminescent device, comprising:
    a first emissive layer capable of emitting light in a first spectrum;
    a second emissive layer disposed over said first emissive layer, said first emissive layer having a solubility characteristic insoluble to the material used in fabricating said second emissive layer, wherein said second emissive layer is capable of emitting light in a second spectrum; and
    a third emissive layer disposed over said second emissive layer, said second emissive layer having a solubility characteristic insoluble to the material used in fabricating said third emissive layer, wherein said third emissive layer is capable of emitting light in a third spectrum, wherein each of said first emissive layer, said second emissive layer and said third emissive layer includes at least one selected from the group consisting of a polymer, polymer blend, and co-polymer and wherein the at least one of a polymer, polymer blend and co-polymer of the first emissive layer does not dissolve or degrade in a solvent used in fabricating the second emissive layer and the at least one of the polymer, polymer blend and co-polymer of the second emissive layer does not dissolve or degrade in a solvent used in fabricating the third emissive layer.

2. A device according to claim 1 further comprising a substrate; and
    an anode disposed over said substrate.

3. A device according to claim 2 further comprising a hole transporting layer, said hole transporting layer disposed between said anode and said first emissive layer.

4. A device according to claim 2 further comprising a electron transporting layer, said electron transporting layer disposed over said third emissive layer.

5. A device according to claim 2 further comprising a cathode layer, said cathode layer disposed over said third emissive layer.

6. A device according to claim 4 further comprising a cathode layer, said cathode layer disposed over said electron transporting layer.

7. A device according to claim 1 wherein said first spectrum, said second spectrum and said third spectrum combine such that a combined output spectrum of said device is white.

8. A device according to claim 1 wherein at least one of said first, second and third emissive layers comprises a conjugated polymer layer.

9. A device according to claim 1 wherein said first emissive layer, said second emissive layer and said third emissive layer additionally includes a monomer, oligomer, or an organic side-group.

10. A device according to claim 1 wherein said first spectrum includes green.

11. A device according to claim 10 wherein said second spectrum includes blue.

12. A device according to claim 11 wherein said third spectrum includes at least one of red, orange and yellow.

13. A device according to claim 10 wherein said second spectrum includes at least one of red, orange and yellow.

14. A device according to claim 11 wherein said third spectrum includes blue.

15. A device according to claim 1 wherein said first spectrum includes blue.

16. A device according to claim 15 wherein said second spectrum includes green.

17. A device according to claim 16 wherein said third spectrum includes at least one of red, orange and yellow.

18. A device according to claim 15 wherein said second spectrum includes at least one of red, orange and yellow.

19. A device according to claim 16 wherein said third spectrum includes green.

20. A device according to claim 1 wherein said first spectrum includes at least one of red, orange and yellow.

21. A device according to claim 20 wherein said second spectrum includes green.

22. A device according to claim 21 wherein said third spectrum includes blue.

23. A device according to claim 20 wherein said second spectrum includes blue.

24. A device according to claim 21 wherein said third spectrum includes green.

25. A method for fabricating an organic electroluminescent device, said method comprising:
fabricating a first emissive layer capable of emitting light in a first spectrum;
fabricating a second emissive layer disposed over said first emissive layer, said first emissive layer having a solubility characteristic insoluble to the material used in fabricating said second emissive layer, wherein said second emissive layer is capable of emitting light in a second spectrum; and
fabricating a third emissive layer disposed over said second emissive layer, said second emissive layer having a solubility characteristic insoluble to the material used in fabricating said third emissive layer, wherein said third emissive layer is capable of emitting light in a third spectrum, wherein each of said first emissive layer, said second emissive layer and said third emissive layer includes at least one selected from a group consisting of a polymer, polymer blend, and co-polymer and wherein the at least one of a polymer, polymer blend and co-polymer of the first emissive layer does not dissolve or degrade in a solvent used in fabricating the second emissive layer and the at least one of the polymer, polymer blend and co-polymer of the second emissive layer does not dissolve or degrade in a solvent used in fabricating the third emissive layer.

26. A method according to claim 25 further comprising fabricating a substrate; and
fabricating an anode disposed over said substrate.

27. A method according to claim 26 further comprising fabricating a hole transporting layer, said hole transporting layer disposed between said anode and said first emissive layer.

28. A method according to claim 25 further comprising fabricating a electron transporting layer, said electron transporting layer disposed over said third emissive layer.

29. A method according to claim 26 further comprising fabricating a cathode layer, said cathode layer disposed over said third emissive layer.

30. A method according to claim 28 further comprising a cathode layer, said cathode layer disposed over said electron transporting layer.

31. A method according to claim 25 wherein said first spectrum, said second spectrum and said third spectrum combine such that a combined output spectrum of said device is white.

32. A device according to claim 1 wherein the electron and hole mobilities of said emissive layers enable a large recombination zone for emission.

33. A method according to claim 25 wherein the electron and hole mobilities of said emissive layers enable a large recombination zone for emission.

* * * * *